United States Patent  
Leiba et al.

(10) Patent No.: US 8,851,908 B1  
(45) Date of Patent: Oct. 7, 2014

(54) ELECTRICAL CONNECTOR WITH GROUND TRACES

(71) Applicant: Google Inc., Mountain View, CA (US)

(72) Inventors: Aaron Leiba, San Francisco, CA (US); Adam Rodriguez, San Francisco, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 14/094,133

(22) Filed: Dec. 2, 2013

(51) Int. Cl.
*H01R 13/658* (2011.01)
*H01R 4/66* (2006.01)

(52) U.S. Cl.
CPC ............... *H01R 4/66* (2013.01); *H01R 13/658* (2013.01)
USPC ........................................................ 439/92

(58) Field of Classification Search
USPC ........... 439/497, 620.22, 607.01, 92; 174/350
See application file for complete search history.

(56) References Cited

U.S. PATENT DOCUMENTS

| | | | |
|---|---|---|---|
| 4,077,690 A | 3/1978 | Koether | |
| 4,993,975 A | 2/1991 | Asick et al. | |
| 5,278,725 A | 1/1994 | Konno et al. | |
| 5,751,544 A | 5/1998 | Song | |
| 5,771,540 A | 6/1998 | Carpenter et al. | |
| 5,941,729 A | 8/1999 | Sri-Jayantha | |
| 6,431,887 B1 | 8/2002 | Yeomans et al. | |
| 6,461,192 B1 | 10/2002 | Kwoka | |
| 6,481,057 B2 | 11/2002 | Lin | |
| 7,055,215 B1 | 6/2006 | Ligtenberg et al. | |
| 7,645,143 B2 | 1/2010 | Rohrbach et al. | |
| 7,984,532 B2 | 7/2011 | Huang | |
| 8,011,950 B2 * | 9/2011 | McGrath et al. | 439/497 |
| 8,091,178 B2 | 1/2012 | Degner et al. | |
| 2006/0024997 A1 | 2/2006 | Teicher | |
| 2006/0065681 A1 | 3/2006 | Yeh et al. | |
| 2007/0186382 A1 | 8/2007 | Huang | |
| 2008/0009189 A1 * | 1/2008 | Wu | 439/607 |
| 2010/0210142 A1 * | 8/2010 | McGrath et al. | 439/620.22 |
| 2012/0015561 A1 | 1/2012 | Tsai | |
| 2013/0115821 A1 | 5/2013 | Golko et al. | |

FOREIGN PATENT DOCUMENTS

| | | |
|---|---|---|
| EP | 1670101 A1 | 6/2006 |
| EP | 1933259 A1 | 6/2008 |
| WO | 2011/150403 A1 | 12/2011 |

OTHER PUBLICATIONS

"Bare PCB Test Probes", Datasheet, Feb. 16, 2012, 1 page.
"Apple Connector", May 15, 2013, 1 page.
"Apple is Granted 6 MacBook Pro Design Patents in Hong Kong", Patently Apple, retrieved on Apr. 16, 2013 from www.patentlapple.com/patently-apple/2013/04/apple-is-granted-6-macbook-pro-design-patents-in-hong-kong.htm, 9 pages.
"Apple Lightning", May 15, 2013, 1 page.

(Continued)

*Primary Examiner* — Alexander Gilman
(74) *Attorney, Agent, or Firm* — Brake Hughes Bellermann LLP (57) ABSTRACT

An electrical connector may include a cord comprising a plurality of wires and a plug extending from the cord. The plug may include a row of conductive signal pads arranged in a plane across the plug, the pads in the row being coupled to the plurality of wires, a plurality of conductive ground traces arranged in the plane across the plug and extending between the pads in the row, with at least one trace extending between adjacent pads, and a ground pad arranged in the plane and located adjacent to the row of conductive signal pads.

19 Claims, 6 Drawing Sheets

(56) References Cited

OTHER PUBLICATIONS

"DisplayPort", from Wikipedia, the free encyclopedia, Sep. 4, 2013, 13 pages.
"HDMI", from Wikipedia, the free encyclopedia, Sep. 4, 2013, 30 pages.
"MacBook Pro (Retina, 15-inch, Early 2013)—Technical Specifications", Mar. 19, 2013, 4 pages.
"Micro USB Plug", May 15, 2013, 1 page.
Schock, "How to Fix a Wobbly Macbook Pro Screen", retrieved from schock.net/articles/2012/02/20/how-to-fix-a-wobbly-macbook-pro-screen/, Feb. 20, 2012, 4 pages.
International Search Report and Written Opinion for International Application No. PCT/US2014/010050, mailed Mar. 28, 2014, 15 pages.

* cited by examiner

ELECTRICAL CONNECTOR WITH GROUND TRACES

TECHNICAL FIELD

This description relates to electrical connectors.

BACKGROUND

Electrical connectors may transmit electrical signals and/or power between electrical devices. Various contact portions of a connector may increase a size of the connector.

SUMMARY

An electrical connector may include pads for transmitting signals between electrical devices. One or more ground traces may extend between the pads. The ground traces may reduce electromagnetic interference. The use of ground traces between the pads, rather than separate ground pads, may reduce a size of the connector.

According to an example embodiment, an electrical connector may include a cord comprising a plurality of wires and a plug extending from the cord. The plug may include a row of conductive signal pads arranged in a plane across the plug, the pads in the row being coupled to the plurality of wires, a plurality of conductive ground traces arranged in the plane across the plug and extending between the pads in the row, with at least one trace extending between adjacent pads, and a ground pad arranged in the plane and located adjacent to the row of conductive signal pads.

According to another example embodiment, an electrical connector may include a cord comprising at least a first wire and a second wire, and a plug extending from the cord. The plug may include a first contact pad coupled to the first wire, a second contact pad coupled to the second wire, a ground trace extending between the first contact pad and the second contact pad, a ground pad coupled to the ground trace, the ground pad being located between the first and second contacts and the cord, and an overmold covering the ground trace, the overmold including at least a first aperture exposing the first contact pad, a second aperture exposing the second contact pad, and a third aperture exposing the ground pad.

According to another example embodiment, an electrical connector may include a cord and a plug extending from the cord. The cord may include a first wire, a second wire, a third wire, a fourth wire, a fifth wire, a sixth wire, and a seventh wire. The plug may include a first signal pad coupled to the first wire, a second signal pad coupled to the second wire, a third signal pad coupled to the third wire, a fourth signal pad coupled to the fourth wire, a fifth signal pad coupled to the fifth wire, a sixth signal pad coupled to the sixth wire, a seventh signal pad coupled to the seventh wire, a first ground trace adjacent to the first signal pad, a second ground trace on an opposite side of the first signal pad from the first ground trace and extending between the first signal pad and the second signal pad, a third ground trace extending between the second signal pad and the third signal pad, a fourth ground trace extending between the third signal pad and the fourth signal pad, a fifth ground trace extending between the fourth signal pad and the fifth signal pad, a sixth ground trace extending between the fifth signal pad and the sixth signal pad, a seventh ground trace extending between the sixth signal pad and the seventh signal pad, an eighth ground trace extending on an opposite side of the seventh signal pad from the seventh ground trace, a ground contact coupled to the first ground trace, the second ground trace, the third ground trace, the fourth ground trace, the fifth ground trace, the sixth ground trace, the seventh ground trace, and the eighth ground trace, the ground contact extending being farther from the cord than the first signal pad, the second signal pad, the third signal pad, the fourth signal pad, the fifth signal pad, the sixth signal pad, and the seventh signal pad, a ground pad coupled to the first ground trace, the second ground trace, the third ground trace, the fourth ground trace, the fifth ground trace, the sixth ground trace, the seventh ground trace, and the eighth ground trace, the ground pad extending being closer to the cord than the first signal pad, the second signal pad, the third signal pad, the fourth signal pad, the fifth signal pad, the sixth signal pad, and the seventh signal pad, and an overmold covering the first ground trace, the second ground trace, the third ground trace, the fourth ground trace, the fifth ground trace, the sixth ground trace, the seventh ground trace, the eighth ground trace, and the ground contact, the overmold including at least a first aperture exposing the first signal pad, a second aperture exposing the second signal pad, a third aperture exposing the third signal pad, a fourth aperture exposing the fourth signal pad, a fifth aperture exposing the fifth signal pad, a sixth aperture exposing the sixth signal pad, a seventh aperture exposing the seventh signal pad, and an eighth aperture exposing the ground pad.

The details of one or more implementations are set forth in the accompanying drawings and the description below. Other features will be apparent from the description and drawings, and from the claims.

BRIEF DESCRIPTION OF THE DRAWINGS

Like reference numbers in the drawings refer to like elements.

DETAILED DESCRIPTION

Figure 1:
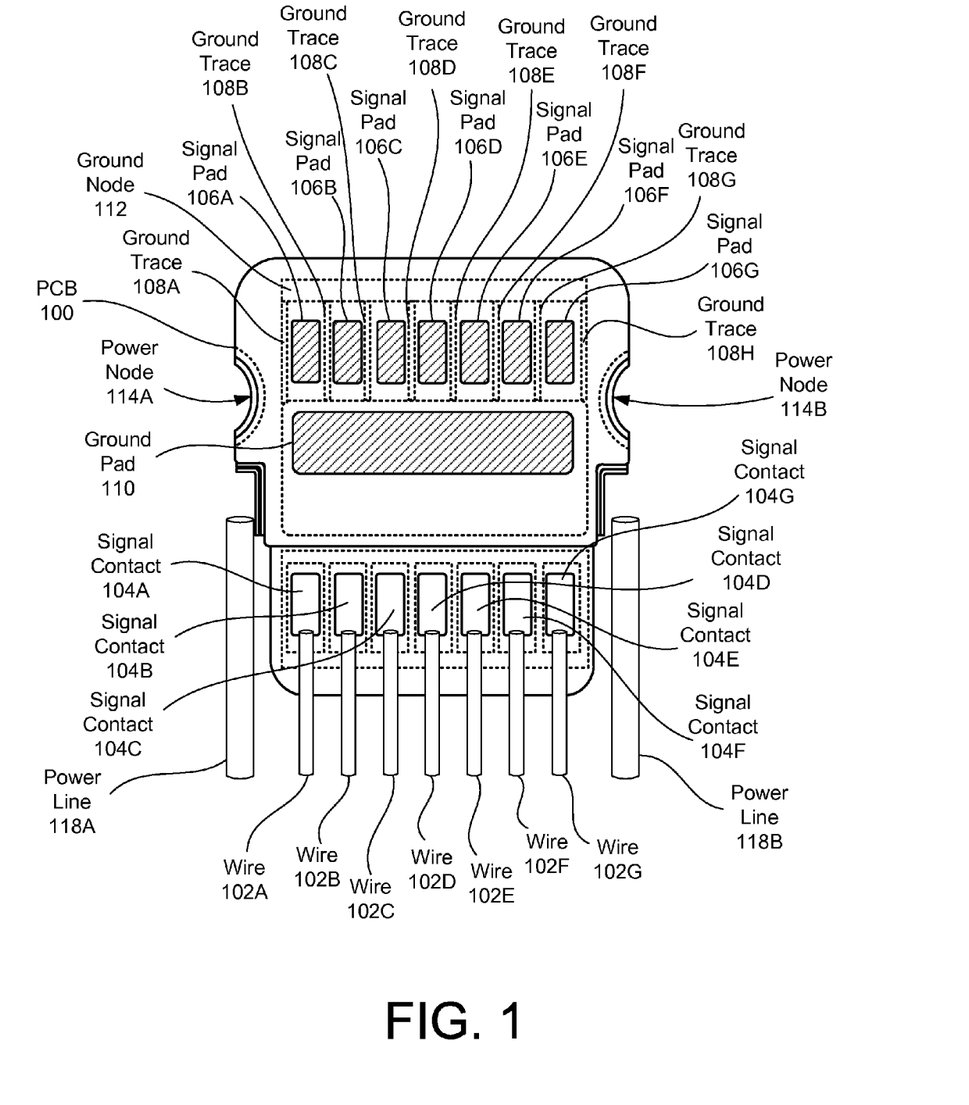
FIG. 1 is a diagram showing components of an electrical connector.
Figure 3:
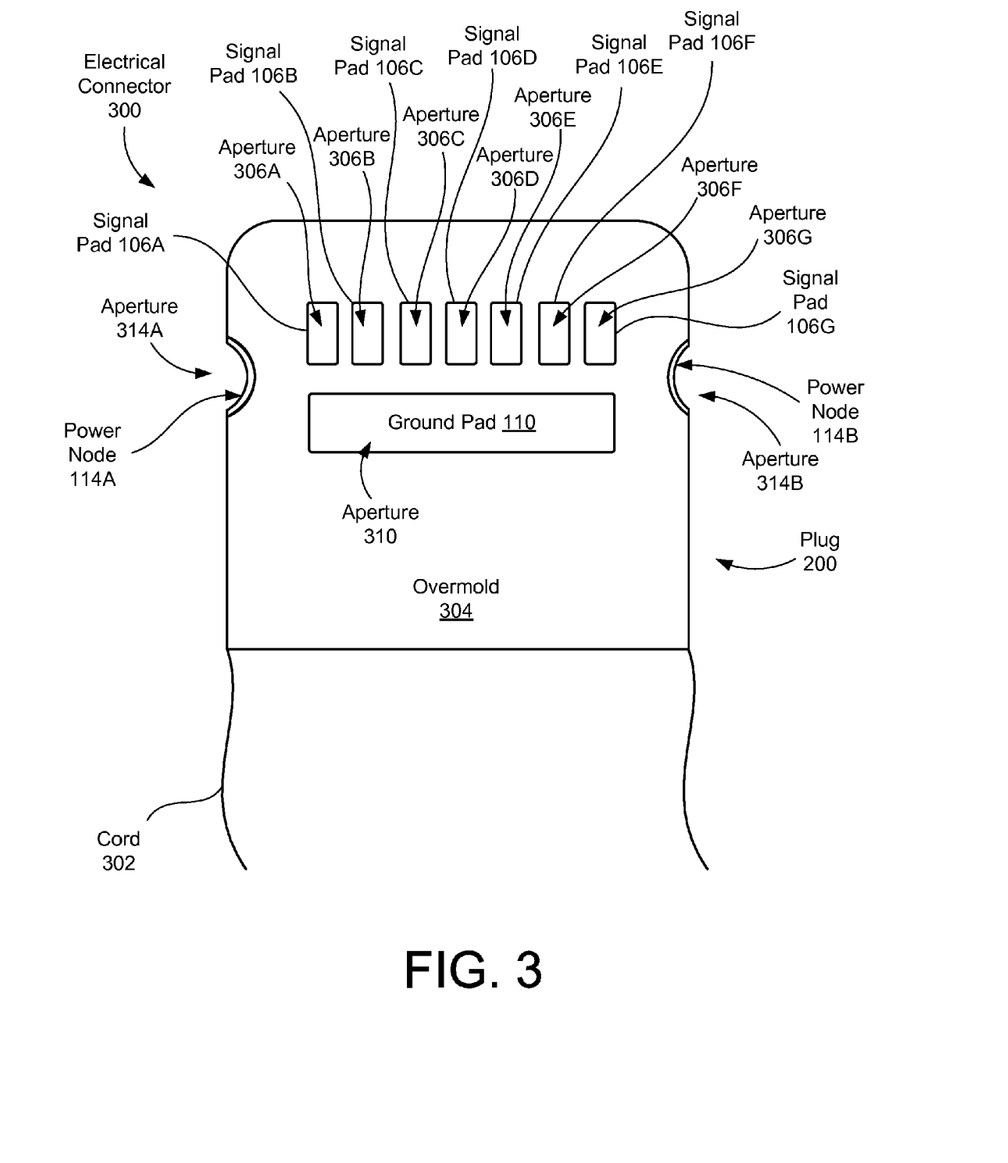
FIG. 3 is a diagram of the electrical connector.

FIG. 1 is a diagram showing internal components of an electrical connector (labeled in FIG. 3). The internal components may be included in, and/or attached to, a printed circuit board (PCB) 100. The electrical connector may include, for example, a Universal Serial Bus (USB) connector. The electrical connector may be plugged into a socket of a computing device, and may transmit signals between the computing device and another device to which the electrical connector is coupled.

The electrical connector may include multiple signal pads 106A, 106B, 106C, 106D, 106E, 106F, 106G on the PCB 100. While seven signal pads 106A, 106B, 106C, 106D, 106E, 106F, 106G. are shown in FIG. 1, any number of signal pads 106A, 106B, 106C, 106D, 106E, 106F, 106G, such as one, two, three, four, five, six, seven, eight, nine, ten, or more signal pads 106A, 106B, 106C, 106D, 106E, 106F, 106G. may be included in the electrical connector.

The signal pads 106A, 106B, 106C, 106D, 106E, 106F, 106G, which may also be referred to as pads or contact pads, may form a row across the PCB 100. The signal pads 106A, 106B, 106C, 106D, 106E, 106F, 106G may be arranged in a single plane across the PCB 100 and/or plug. In an example embodiment, the PCB 100 and/or plug may not include any signal pads 106A, 106B, 106C, 106D, 106E, 106F, 106G that are not in the plane. The signal pads 106A, 106B, 106C, 106D, 106E, 106F, 106G may be arranged in the row latitudinally in a direction perpendicular to a direction in which wires 102A, 102B, 102C, 102D, 102E, 102E, 102F, 102G, to which the signal pads 106A, 106B, 106C, 106D, 106E, 106F, 106G are respectively coupled, extend from the PCB 100 and/or electrical connector, and/or perpendicular to a direction in which a plug (not labeled in FIG. 1) which includes the signal pads 106A, 106B, 106C, 106D, 106E, 106F, 106G extends from a cord (not labeled in FIG. 1) which includes the wires 102A, 102B, 102C, 102D, 102E, 102E, 102F, 102G, to which the signal pads 106A, 106B, 106C, 106D, 106E, 106F, 106G are coupled.

The signal pads 106A, 106B, 106C, 106D, 106E, 106F, 106G may couple to nodes or pins inside an electronic device when the electrical connector is inserted into the electronic device. As shown and described further with respect to FIG. 3, when the electrical connector is fully assembled and the PCB 100 is covered by an overmold, the signal pads 106A, 106B, 106C, 106D, 106E, 106F, 106G may be exposed, allowing the coupling between the signal pads 106A, 106B, 106C, 106D, 106E, 106F, 106G and nodes or pins inside the electronic device.

The signal pads 106A, 106B, 106C, 106D, 106E, 106F, 106G may include electrical contacts, and may receive and transmit electrical signals between devices to which the electrical connector is coupled.

The electrical connector may include ground traces 108A, 108B, 108C, 108D, 108E, 108F, 108G, 108H on the PCB 100 extending between and/or around the signal pads 106A, 106B, 106C, 106D, 106E, 106F, 106G. At least one of the ground traces 108A, 108B, 108C, 108D, 108E, 108F, 108G, 108H may extend between two adjacent signal pads 106A, 106B, 106C, 106D, 106E, 106F, 106G. The ground traces 108A, 108B, 108C, 108D, 108E, 108F, 108G, 108H may be arranged in a plane across the PCB 100 and/or plug. The ground traces 108A, 108B, 108C, 108D, 108E, 108F, 108G, 108H may be printed onto the PCB 100, and may comprise a conductive material, such as metal including copper, aluminum, silver, or gold. When the electrical connector is fully assembled and the PCB 100 is covered with an overmold, the ground traces 108A, 108B, 108C, 108D, 108E, 108F, 108G, 108H may be covered by the overmold, preventing the ground traces 108A, 108B, 108C, 108D, 108E, 108F, 108G, 108H from contacting the nodes or pins inside the electronic device into which the electrical connector is inserted.

The signal pads 106A, 106B, 106C, 106D, 106E, 106F, 106G may define a plurality of spaces between the signal pads 106A, 106B, 106C, 106D, 106E, 106F, 106G, and one of the ground traces 108A, 108B, 108C, 108D, 108E, 108F, 108G, 108H may extend through each of the spaces. One ground trace 108A, 108H may also be located at each end of the row of signal pads 106A, 106B, 106C, 106D, 106E, 106F, 106G, so that the row of signal pads 106A, 106B, 106C, 106D, 106E, 106F, 106G is surrounded by ground traces 108A, 108B, 108C, 108D, 108E, 108F, 108G, 108H at both ends. The ground traces 108A, 108B, 108C, 108D, 108E, 108F, 108G, 108H may shield electromagnetic radiation emitted by particular signal pads 106A, 106B, 106C, 106D, 106E, 106F, 106G from interfering with each other.

The ground traces 108A, 108B, 108C, 108D, 108E, 108F, 108G, 108H may have smaller and/or narrower widths than the signal pads 106A, 106B, 106C, 106D, 106E, 106F, 106G. The ground traces 108A, 108B, 108C, 108D, 108E, 108F, 108G, 108H may each be, for example, less than, or no more than, half as wide as each of the signal pads 106A, 106B, 106C, 106D, 106E, 106F, 106G. The respective sizes of the ground traces 108A, 108B, 108C, 108D, 108E, 108F, 108G, 108H and signal pads 106A, 106B, 106C, 106D, 106E, 106F, 106G are discussed in further detail with respect to FIG. 2. The smaller and/or narrower widths of the ground traces 108A, 108B, 108C, 108D, 108E, 108F, 108G, 108H may allow the PCB 100 and/or electrical connector to be manufactured with a narrower width and/or smaller size than if the PCB 100 and/or electrical connector were manufactured with ground pads of similar size to the signal pads 106A, 106B, 106C, 106D, 106E, 106F, 106G.

In an example implementation, the PCB 100 may include a ground trace 108A, 108B, 108C, 108D, 108E, 108F, 108G, 108H extending between each pair of adjacent signal pads 106A, 106B, 106C, 106D, 106E, 106F, 106G. In this example, the ground trace 108B extends between signal pads 106A, 106B, ground trace 108C extends between signal pads 106B, 106C, ground trace 108D extends between signal pads 106C, 106D, ground trace 108E extends between signal pads 106D, 106E, ground trace 108F extends between signal pads 106E, 106F, and ground trace 108G extends between signal pads 106F, 106G. Ground trace 108A may be adjacent to a signal pad 106A that is at one end of the row of signal pads, and ground trace 108A may be on an opposite side of the signal pad 106A from ground trace 108B. Similarly, ground trace 108H may be adjacent to a signal pad 106G that is at an opposite end of the row of signal pads, and ground trace 108H may be on an opposite side of the signal pad 106G from ground trace 108G.

In an example implementation, the PCB 100 may include ground traces 108A, 108B, 108C, 108D, 108E, 108F, 108G, 108H extending only between pairs of differential signaling nodes and/or differential signaling pads, and/or between pairs of high-speed differential signaling nodes. In an example implementation, signal pads 106A, 106B may include differential transmission nodes, signal pads 106F, 106G may include differential reception nodes, signal pads 106C, 106E may include a differential channel such as a USB2 differential channel, and signal pad 106D may include a control channel. The PCB 100 may include ground traces 108A, 108B, 108C, 108D, 108E, 108F, 108G, 108H extending between each pair of adjacent signal pads 106A, 106B, 106C, 106D, 106E, 106F, 106G as described in the above paragraph. In another example implementation, the PCB 100 may include ground trace 108B extending between the differential transmission signal pads 106A, 106B and/or differential signaling pads and ground trace 108G extending between the differential reception pads 106F, 106G and/or differential signaling pads, but not include any other ground traces 108A, 108C, 108D, 108E, 108H.

In another example implementation, the PCB 100 may include ground traces between pairs of adjacent signal pads 106A, 106B, 106C, 106D, 106E, 106F, 106G that are not differential signaling pads, and not include ground traces extending between pairs of adjacent signal pads 106A, 106B, 106C, 106D, 106E, 106F, 106G that are pairs of differential signaling pads. For example, the PCB 100 may include ground trace 108C between the pair of adjacent signal pads 106B, 106C that are not differential signaling pads, ground trace 108D between adjacent signal pads 106C, 106D that are not differential signaling pads, ground trace 108E between adjacent signal pads 106D, 106E that are not differential signaling pads, and ground trace 108F between adjacent signal pads 106E, 106F that are not differential signaling pads, but not include, ground trace 108B between differential signal pads 106A, 106B and not include ground trace 108F between differential signaling pads 106F, 106G. When the PCB 100 includes ground traces only between differential signaling pads, or only between adjacent signaling pads that are not differential signaling pads, the PCB 100 may or may not include the ground traces 108A, 108G that are adjacent to end signal pads 106A, 106G and not between two signal pads.

The electrical connector may also include a ground node 112 on the PCB 100. The ground node 112 may be in front of and/or adjacent to the row of signal pads 106A, 106B, 106C, 106D, 106E, 106F, 106G on a side of the signal pads 106A, 106B, 106C, 106D, 106E, 106F, 106G that is farther or distal from the wires 102A, 102B, 102C, 102D, 102E, 102F, 102G and/or cord than the signal pads 106A, 106B, 106C, 106D, 106E, 106F, 106G. The ground node 112 may be printed onto the PCB 100 in a similar manner to the ground traces 108A, 108B, 108C, 108D, 108E, 108F, 108G, 108H, and may comprise a conductive material, such as metal including copper, aluminum, silver, or gold. The ground node 112 may be coupled to any or all of the ground traces 108A, 108B, 108C, 108D, 108E, 108F, 108G, 108H. The ground node 112 may complement or augment the ground traces 108A, 108B, 108C, 108D, 108E, 108F, 108G, 108H by shielding electromagnetic radiation emitted by the signal pads 106A, 106B, 106C, 106D, 106E, 106F, 106G. When the electrical connector is fully assembled and the PCB 100 is covered by an overmold, the ground node 112 may be covered by the overmold, preventing the ground node 112 from contacting the nodes or pins inside the electronic device into which the electrical connector is inserted.

The electrical connector may also include a ground pad 110 on the PCB 100. The ground pad 110 may be substantially rectangular, with a parallel top and bottom and parallel sides. The ground pad 110 may have rounded corners. The ground pad 110 may be behind the signal pads 106A, 106B, 106C, 106D, 106E, 106F, 106G and/or closer to the wires 102A, 102B, 102C, 102D, 102E, 102F, 102G and/or cord than the signal pads 106A, 106B, 106C, 106D, 106E, 106F, 106G, and/or located between the cord and the row of signal pads 106A, 106B, 106C, 106D, 106E, 106F, 106G. The ground pad 110 may be coupled to any or all of the ground traces 108A, 108B, 108C, 108D, 108E, 108F, 108G, 108H. The ground pad 110 may extend across the PCB 100 and/or plug in a direction substantially parallel to the row of signal pads 106A, 106B, 106C, 106D, 106E, 106F, 106G, with the parallel orientation varying by up to five degrees. The ground pad 110 may complement or augment the ground traces 108A, 108B, 108C, 108D, 108E, 108F, 108G, 108H by absorbing electromagnetic radiation emitted by the signal pads 106A, 106B, 106C, 106D, 106E, 106F, 106G. The ground pad 110 may also conduct and radiate heat away from other components of the PCB 100, keeping the temperature of the electrical connector, plug, and/or PCB 100 down. When the electrical connector is fully assembled and the PCB 100 is covered by an overmold, the ground pad 110 may be exposed, allowing the ground pad to be coupled to a ground node or pin of the electronic device into which the electrical connector is inserted, thereby grounding the plug and/or electrical connector. The ground pad 110 may be located behind the signal pads 106A, 106B, 106C, 106D, 106E, 106F, 106G, which are also exposed, to prevent the ground pad 110 from coupling with any signal nodes or pins of the electronic device, which could result in a short circuit.

The electrical connector may also include signal contacts 104A, 104B, 104C, 104D, 104E, 104F, 104G behind the ground pad 110 on the PCB 100. Each of the signal contacts 104A, 104B, 104C, 104D, 104E, 104F, 104G may be coupled to a respective signal pad 106A, 106B, 106C, 106D, 106E, 106F, 106G and to a respective wire 102A, 102B, 102C, 102D, 102E, 102F, 102G. The wires 102A, 102B, 102C, 102D, 102E, 102F, 102G may be included in a cord and electrically isolated from each other, and may be surrounded by an insulative material such as plastic or rubber (not shown in FIG. 1).

The electrical connector may also include power nodes 114A, 114B. The power nodes 114A, 114B may be located in recessed areas or apertures on sides of the PCB 100. When the electrical connector is fully assembled and the PCB 100 is covered by an overmold, the power nodes 114A, 114B may be exposed, allowing the power nodes 114A, 114B to couple to power nodes or pins of the electronic device into which the electrical connector is inserted. The power nodes 114A, 114B may each be respectively coupled to a power line 118A, 118B. The power lines 118A, 118B may be included in the cord with the wires 102A, 102B, 102C, 102D, 102E, 102F, 102G, and may be electrically isolated from each other and from the wires 102A, 102B, 102C, 102D, 102E, 102F, 102G.

Figure 2:
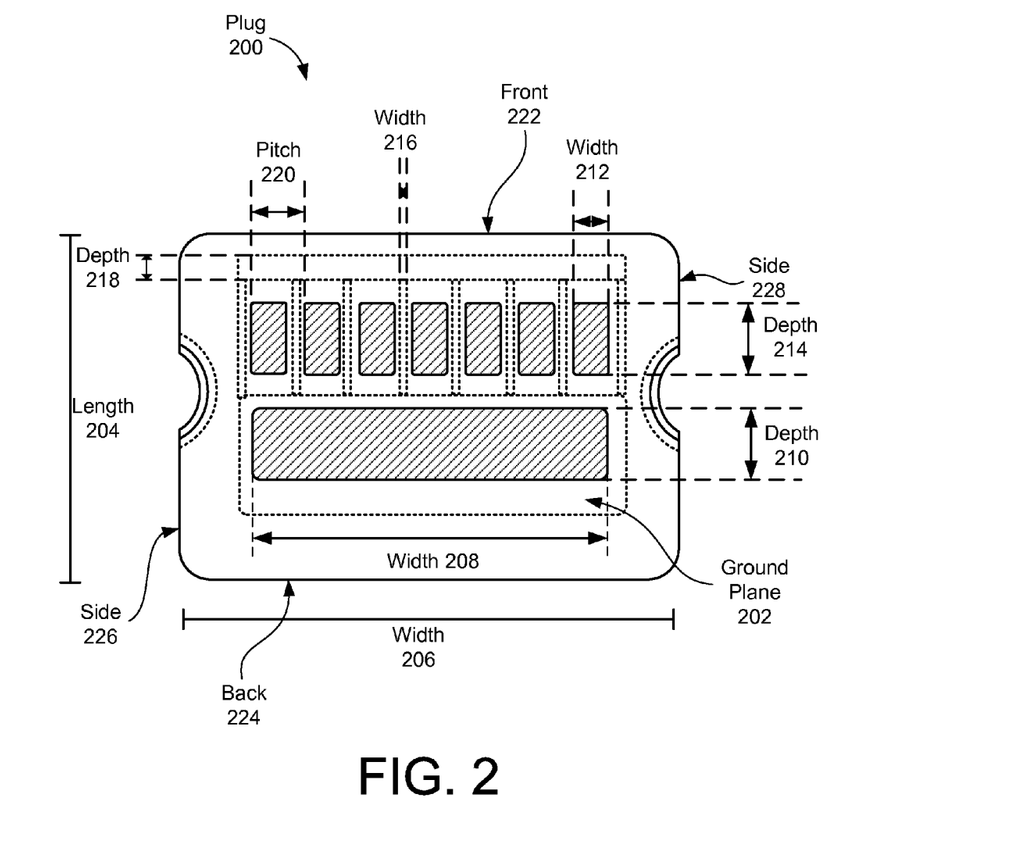
FIG. 2 is a diagram showing components of a plug of the electrical connector.

FIG. 2 is a diagram showing components of a plug 200 of the electrical connector. The plug 200 may be a separate PCB from components included in the cord (not shown in FIG. 2), or may be a part of the PCB 100 (not labeled in FIG. 2) which includes the signal pads 106A, 106B, 106C, 106D, 106E, 106F, 106G, ground traces 108A, 108B, 108C, 108D, 108E, 108F, 108G, 108H, ground node 112, ground pad 110, and power nodes 114A, 114B (none of which are labeled in FIG. 2 for ease of viewing the labels that are included in FIG. 2).

A length 204 of the plug 200, from a front portion 222 of the plug 200 to a back portion 224 of the plug 200, may be less than a width 206 of the plug 200 measured from a first side 226 to a second side 228. The front portion 222 may be flat, and may be on an opposite side of the plug 200 from the wires 102A, 102B, 102C, 102D, 102E, 102F, 102G (not shown in FIG. 2) and/or from the cord (not shown in FIG. 2). The back portion 224 may be flat, and may be on a same side of the plug 200 from the wires 102A, 102B, 102C, 102D, 102E, 102F, 102G and/or from the cord. The first side 226 may be flat and adjacent to the front portion 222 and back portion 224. The second side 228 may be flat, adjacent to the front portion 222 and back portion 224, and opposite to the first side 226. In an example implementation, the plug 200 may be rectangular with tapered or chamfered corners.

The ground pad 110 may be included on and/or surrounded by a ground plane 202. The ground plane 202 may be a part of the plug 200 that is printed onto the PCB 100 in a similar manner to the ground traces 108A, 108B, 108C, 108D, 108E, 108F, 108G, 108H and ground node 112, and may comprise a conductive material, such as metal including copper, aluminum, silver, or gold. The ground plane 202 may couple the ground pad 110 to the ground traces 108A, 108B, 108C, 108D, 108E, 108F, 108G, 108H, and/or may absorb electromagnetic radiation emitted by the signal pads 106A, 106B, 106C, 106D, 106E, 106F, 106G. When the electrical connector is fully assembled and the PCB 100 is covered by the overmold, the ground plane 202 may be covered by the overmold.

A width 208 of the ground pad 110 may be less than the width 206 of the plug 200, and may be greater than a sum of the widths 212 of the signal pads 106A, 106B, 106C, 106D, 106E, 106F, 106G. The width 208 of the ground pad 110 may be, for example, between 3.5 and 4.0 millimeters. The width 212 of each of the signal pads 106A, 106B, 106C, 106D, 106E, 106F, 106G may be, for example, between two-tenths and four-tenths of a millimeter. A depth 210 of the ground pad 110 may be the same as, or substantially similar to, a depth 214 of the signal pads 106A, 106B, 106C, 106D, 106E, 106F, 106G, such as between 0.9 and 1.1 millimeters.

A width 216 of each of the ground traces 108A, 108B, 108C, 108D, 108E, 108F, 108G, 108H may be less than, such as less than half, the width 212 of the signal pads 106A, 106B, 106C, 106D, 106E, 106F, 106G. The width 216 of each of the ground traces 108A, 108B, 108C, 108D, 108E, 108F, 108G, 108H may be, for example, between 0.09 and 0.11 millimeters. The ground traces 108A, 108B, 108C, 108D, 108E, 108F, 108G, 108H may be between 0.04 and 0.06 millimeters from each adjacent signal pad 106A, 106B, 106C, 106D, 106E, 106F, 106G. A pitch 220, or space or distance occupied by each signal pad 106A, 106B, 106C, 106D, 106E, 106F, 106G and adjacent ground trace 108A, 108B, 108C, 108D, 108E, 108F, 108G, 108H, may be between 0.4 and 0.6 millimeters. A depth 218 of the ground node 112 may be the same or greater than the width 216 of the ground traces 108A, 108B, 108C, 108D, 108E, 108F, 108G, 108H, and less than the depth 210 of the ground pad 110.

FIG. 3 is a diagram of the electrical connector 300. In this example, the PCB 100 (not shown in FIG. 3) is covered by an overmold 304, and a cord 302 covers and/or includes the wires 102A, 102B, 102C, 102D, 102E, 102F, 102G (not shown in FIG. 3). The overmold 304 may be made of a non-conductive and/or insulative material, such as plastic or rubber, and may be considered a non-conductive overmold and/or an insulative overmold. The plug 200 may extend from the cord 302 in a longitudinal direction perpendicular to the latitudinal direction in which the signal pads 106A, 106B, 106C, 106D, 106E, 106F, 106G extend across the PCB 100.

The overmold 304 may include a plurality of apertures. The overmold 304 may include a row of apertures 306A, 306B, 306C, 306D, 306E, 306F, 306G. Each of the apertures 306A, 306B, 306C, 306D, 306E, 306F, 306G extending longitudinally across the plug 200, exposing their respective signal pads 106A, 106B, 106C, 106D, 106E, 106F, 106G. The row formed by the apertures 306A, 306B, 306C, 306D, 306E, 306F, 306G, and/or along which the apertures 306A, 306B, 306C, 306D, 306E, 306F, 306G, may extend latitudinally across the overmold 304. The signal pads 106A, 106B, 106C, 106D, 106E, 106F, 106G may extend from the PCB 100 a distance that is less than a thickness of the overmold 304. The extension of the signal pads 106A, 106B, 106C, 106D, 106E, 106F, 106G from the PCB 100 less than the thickness of the overmold 304 may cause the signal pads 106A, 106B, 106C, 106D, 106E, 106F, 106G to be recessed within the apertures 306A, 306B, 306C, 306D, 306E, 306F, 306G, preventing the signal pads 106A, 106B, 106C, 106D, 106E, 106F, 106G from being accidentally contacted by objects that do not extend into the apertures 306A, 306B, 306C, 306D, 306E, 306F, 306G. This recession within the apertures 306A, 306B, 306C, 306D, 306E, 306F, 306G may prevent short circuiting of the signal pads 106A, 106B, 106C, 106D, 106E, 106F, 106G.

The overmold 304 may also include an aperture 310 exposing the ground pad 110. The aperture 310 may extend along the overmold 304 in a direction parallel to the direction that the row of apertures 306A, 306B, 306C, 306D, 306E, 306F, 306G extends latitudinally across the overmold. The aperture 310 may extend in the direction parallel to the row for a length at least as great as a row formed by at least two of the apertures. The greater latitudinal length of the aperture 310 than any of the apertures 306A, 306B, 306C, 306D, 306E, 306F, 306G may allow a ground pin or node from a socket that is too wide to enter any of the apertures 306A, 306B, 306C, 306D, 306E, 306F, 306G to contact the ground pad 110, preventing the ground node or pin from contacting any of the signal pads 106A, 106B, 106C, 106D, 106E, 106F, 106G while sliding across the overmold 304 and then contacting the ground pad 110. The ground pad 110 may extend from the PCB 100 a distance that is equal to or greater than the thickness of the overmold 304. The extension of the ground pad 110 from the PCB 100 a distance equal to or greater than the thickness of the overmold 304 may facilitate easier grounding of the electrical connector 300.

The overmold 304 may also include apertures 314A, 314B exposing the power nodes 114A, 114B. The apertures 314A, 314B may expose the power nodes 114A, 114B so that power nodes in the electronic device can provide power to the electrical connector 300, or the electrical connector 300 can provide power to the electronic device.

Figure 4:
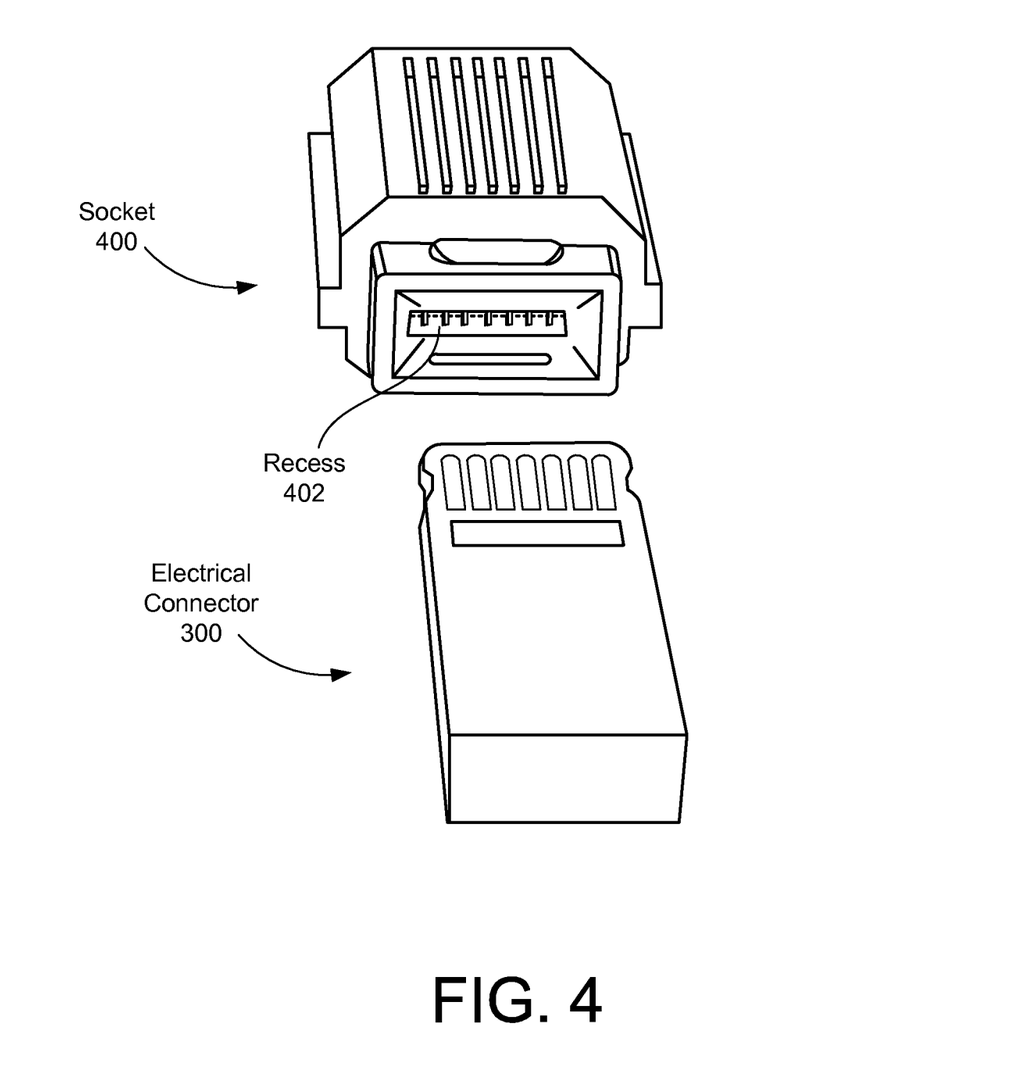
FIG. 4 is a diagram of the electrical connector and a socket that receives the electrical connector.

FIG. 4 is a diagram of the electrical connector 300 and a socket 400 that receives the electrical connector 300. The socket 400 may include a recess 402. The recess 402 may receive the electrical connector 300.

Figure 5:
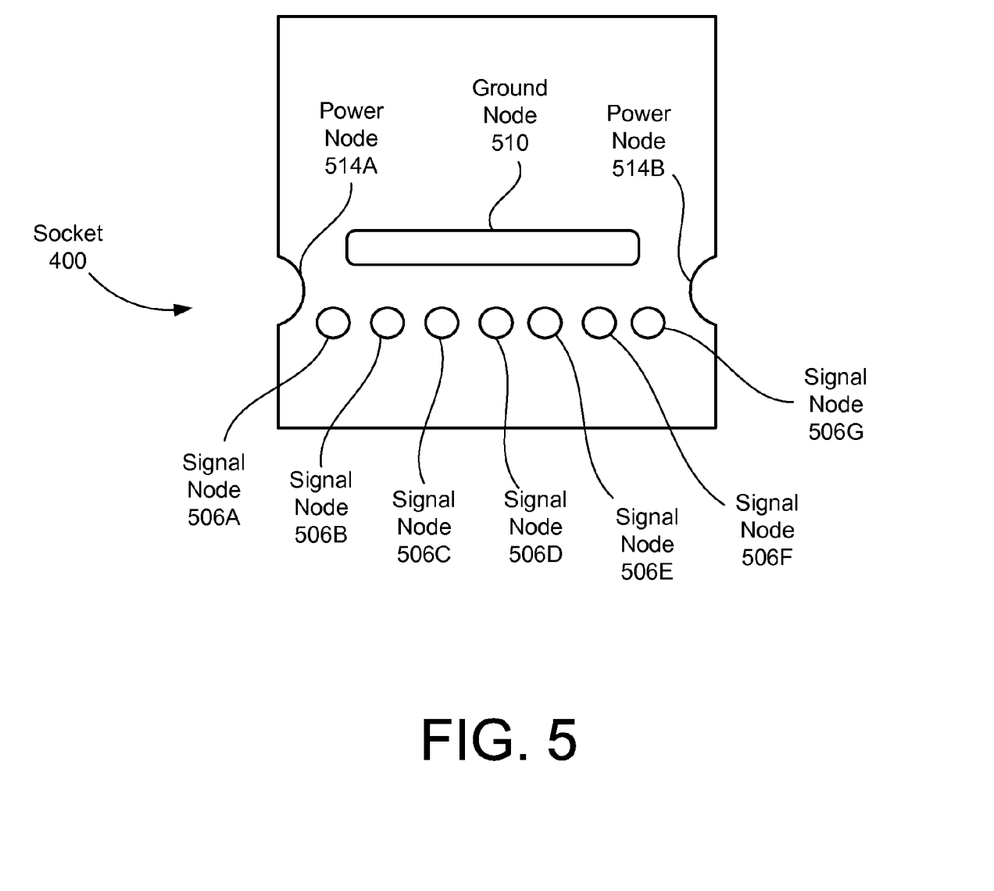
FIG. 5 is a cross-sectional view of the socket.

FIG. 5 is a cross-sectional view of the socket 400. The cross-section may be along the dashed line in the recess 402 shown in FIG. 4.

The socket 400 may include a ground node 510. The ground node 510 may engage the ground pad 110 (not shown in FIG. 5) of the electrical connector 300 (not shown in FIG. 5) and provide grounding to the electrical connector 300 (not shown in FIG. 5). While FIG. 5 shows the ground node 510 as elongated to match the shape of the ground pad 110, the ground node 510 may also be circular or square and engage only a portion of the ground pad 110. The ground node 510 may include a spring finger biased toward the recess 402 to engage the ground pad 110. The ground node 510 may be wider than the apertures 306A, 306B, 306C, 306D, 306E, 306F, 306G (not shown in FIG. 5), preventing the ground node 510 from contacting the signal pads 106A, 106B, 106C, 106D, 106E, 106F, 106G.

The socket 400 may also include power nodes 514A, 514B. The power nodes 514A, 514B may engage the power nodes 114A, 114B of the electrical connector 300, and either provide power to or receive power from the electrical connector 300.

The socket 400 may include a plurality of signal nodes 506A, 506B, 506C, 506D, 506E, 506F, 506G. The signal nodes 506A, 506B, 506C, 506D, 506E, 506F, 506G may engage the signal pads 106A, 106B, 106C, 106D, 106E, 106F, 106G of the electrical connector 300. The signal nodes 506A, 506B, 506C, 506D, 506E, 506F, 506G may include pins and/or spring fingers, and may extend a sufficient distance into the recess 402 (not shown in FIG. 5) to engage the recessed signal pads 106A, 106B, 106C, 106D, 106E, 106F, 106G within their respective apertures 306A, 306B, 306C, 306D, 306E, 306F, 306G. The signal nodes 506A, 506B, 506C, 506D, 506E, 506F, 506G may, for example, be biased toward the recess 402 to engage the signal pads 106A, 106B, 106C, 106D, 106E, 106F, 106G when the plug 200 is inserted into the recess 402.

Figure 6:
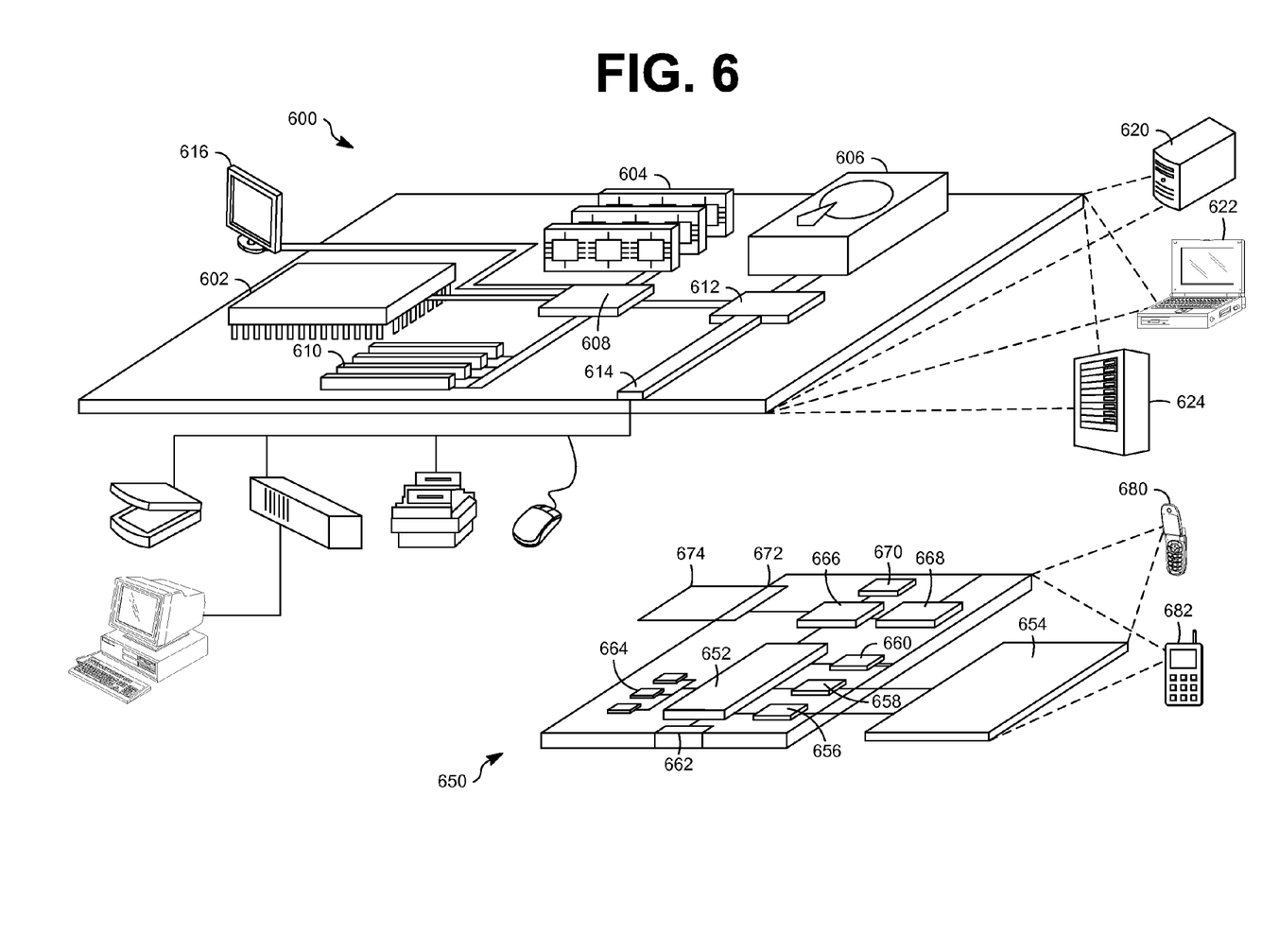
FIG. 6 shows an example of a generic computer device and a generic mobile computer device.

FIG. 6 shows an example of a generic computer device 600 and a generic mobile computer device 650, either of which may include the socket 400 and/or be coupled to the plug 200. Computing device 600 is intended to represent various forms of digital computers, such as laptops, desktops, workstations, personal digital assistants, servers, blade servers, mainframes, and other appropriate computers. Computing device 650 is intended to represent various forms of mobile devices, such as personal digital assistants, cellular telephones, smart phones, and other similar computing devices. The components shown here, their connections and relationships, and their functions, are meant to be exemplary only, and are not meant to limit implementations of the inventions described and/or claimed in this document.

Computing device 600 includes a processor 602, memory 604, a storage device 606, a high-speed interface 608 connecting to memory 604 and high-speed expansion ports 610, and a low speed interface 612 connecting to low speed bus 614 and storage device 606. Each of the components 602, 604, 606, 608, 610, and 612, are interconnected using various busses, and may be mounted on a common motherboard or in other manners as appropriate. The processor 602 can process instructions for execution within the computing device 600, including instructions stored in the memory 604 or on the storage device 606 to display graphical information for a GUI on an external input/output device, such as display 616 coupled to high speed interface 608. In other implementations, multiple processors and/or multiple buses may be used, as appropriate, along with multiple memories and types of memory. Also, multiple computing devices 600 may be connected, with each device providing portions of the necessary operations (e.g., as a server bank, a group of blade servers, or a multi-processor system).

The memory 604 stores information within the computing device 600. In one implementation, the memory 604 is a volatile memory unit or units. In another implementation, the memory 604 is a non-volatile memory unit or units. The memory 604 may also be another form of computer-readable medium, such as a magnetic or optical disk.

The storage device 606 is capable of providing mass storage for the computing device 600. In one implementation, the storage device 606 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 604, the storage device 606, or memory on processor 602.

The high speed controller 608 manages bandwidth-intensive operations for the computing device 600, while the low speed controller 612 manages lower bandwidth-intensive operations. Such allocation of functions is exemplary only. In one implementation, the high-speed controller 608 is coupled to memory 604, display 616 (e.g., through a graphics processor or accelerator), and to high-speed expansion ports 610, which may accept various expansion cards (not shown). In the implementation, low-speed controller 612 is coupled to storage device 606 and low-speed expansion port 614. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 600 may be implemented in a number of different forms, as shown in the figure. For example, it may be implemented as a standard server 620, or multiple times in a group of such servers. It may also be implemented as part of a rack server system 624. In addition, it may be implemented in a personal computer such as a laptop computer 622. Alternatively, components from computing device 600 may be combined with other components in a mobile device (not shown), such as device 650. Each of such devices may contain one or more of computing device 600, 650, and an entire system may be made up of multiple computing devices 600, 650 communicating with each other.

Computing device 650 includes a processor 652, memory 664, an input/output device such as a display 654, a communication interface 666, and a transceiver 668, among other components. The device 650 may also be provided with a storage device, such as a microdrive or other device, to provide additional storage. Each of the components 650, 652, 664, 654, 666, and 668, are interconnected using various buses, and several of the components may be mounted on a common motherboard or in other manners as appropriate.

The processor 652 can execute instructions within the computing device 650, including instructions stored in the memory 664. The processor may be implemented as a chipset of chips that include separate and multiple analog and digital processors. The processor may provide, for example, for coordination of the other components of the device 650, such as control of user interfaces, applications run by device 650, and wireless communication by device 650.

Processor 652 may communicate with a user through control interface 658 and display interface 656 coupled to a display 654. The display 654 may be, for example, a TFT LCD (Thin-Film-Transistor Liquid Crystal Display) or an OLED (Organic Light Emitting Diode) display, or other appropriate display technology. The display interface 656 may comprise appropriate circuitry for driving the display 654 to present graphical and other information to a user. The control interface 658 may receive commands from a user and convert them for submission to the processor 652. In addition, an external interface 662 may be provide in communication with processor 652, so as to enable near area communication of device 650 with other devices. External interface 662 may provide, for example, for wired communication in some implementations, or for wireless communication in other implementations, and multiple interfaces may also be used.

The memory 664 stores information within the computing device 650. The memory 664 can be implemented as one or more of a computer-readable medium or media, a volatile memory unit or units, or a non-volatile memory unit or units. Expansion memory 674 may also be provided and connected to device 650 through expansion interface 672, which may include, for example, a SIMM (Single In Line Memory Module) card interface. Such expansion memory 674 may provide extra storage space for device 650, or may also store applications or other information for device 650. Specifically, expansion memory 674 may include instructions to carry out or supplement the processes described above, and may include secure information also. Thus, for example, expansion memory 674 may be provide as a security module for device 650, and may be programmed with instructions that permit secure use of device 650. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 664, expansion memory 674, or memory on processor 652, that may be received, for example, over transceiver 668 or external interface 662.

Device 650 may communicate wirelessly through communication interface 666, which may include digital signal processing circuitry where necessary. Communication interface 666 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 668. In addition, short-range communication may occur, such as using a Bluetooth, WiFi, or other such transceiver (not shown). In addition, GPS (Global Positioning System) receiver module 670 may provide additional navigation- and location-related wireless data to device 650, which may be used as appropriate by applications running on device 650.

Device 650 may also communicate audibly using audio codec 660, which may receive spoken information from a user and convert it to usable digital information. Audio codec 660 may likewise generate audible sound for a user, such as through a speaker, e.g., in a handset of device 650. Such sound may include sound from voice telephone calls, may include recorded sound (e.g., voice messages, music files, etc.) and may also include sound generated by applications operating on device 650.

The computing device 650 may be implemented in a number of different forms, as shown in the figure. For example, it may be implemented as a cellular telephone 680. It may also be implemented as part of a smart phone 682, personal digital assistant, or other similar mobile device.

While certain features of the described implementations have been illustrated as described herein, many modifications, substitutions, changes and equivalents will now occur to those skilled in the art. It is, therefore, to be understood that the appended claims are intended to cover all such modifications and changes as fall within the true spirit of the embodiments of the invention.

What is claimed is:

1. An electrical connector comprising:
   a cord comprising a plurality of wires; and
   a plug extending from the cord, the plug comprising:
      a row of conductive signal pads arranged in a plane across the plug, the pads in the row being coupled to the plurality of wires;
      a plurality of conductive ground traces arranged in the plane across the plug and extending between the pads in the row, with at least one of the plurality of conductive ground traces extending between adjacent pads, each of the plurality of conductive ground traces being no more than half as wide as each of the conductive signal pads in the row; and
      a ground pad arranged in the plane and located adjacent to the row of conductive signal pads.

2. The electrical connector of claim 1, wherein the row of conductive signal pads extends in a latitudinal direction perpendicular to a longitudinal direction in which the plug extends from the cord.

3. The electrical connector of claim 1, wherein the ground pad is substantially rectangular and extends across the plug in a direction substantially parallel to the row of pads.

4. The electrical connector of claim 1, wherein the ground pad is located between the cord and the row of conductive signal pads.

5. The electrical connector of claim 1, wherein each of the conductive ground traces has a width between 0.09 and 0.11 millimeters.

6. The electrical connector of claim 1, wherein the plug further comprises:
   a ground node extending across the plug adjacent to the row of conductive signal pads on a side of the pads that is distal to the cord, the ground node being coupled to each of the conductive ground traces, wherein the ground pad is coupled to each of the conductive ground traces.

7. The electrical connector of claim 1, wherein:
   the plug comprises a printed circuit board (PCB); and
   the row of pads, plurality of conductive ground traces, and ground pad are included in the PCB.

8. The electrical connector of claim 1, wherein:
   the plug comprises a printed circuit board (PCB); and
   the plurality of conductive ground traces are printed onto the PCB.

9. The electrical connector of claim 1, wherein the plug further comprises a ground plane surrounding the ground pad, the ground plane being conductive and coupled to the plurality of conductive ground traces.

10. The electrical connector of claim 1, wherein the plug comprises conductive ground traces extending only between pairs of differential conductive signal pads and does not comprise conductive ground traces extending between pairs of adjacent conductive signal pads that are not pairs of differential conductive signal pads.

11. The electrical connector of claim 1, wherein the plug comprises conductive ground traces extending between pairs of pads that are not differential conductive signal pads and does not comprise conductive ground traces extending between pairs of adjacent conductive signal pads that are pairs of differential conductive signal pads.

12. The electrical connector of claim 1, wherein the plug does not include any conductive signal pads that are not in the plane.

13. An electrical connector comprising:
   a cord comprising at least a first wire and a second wire; and
   a plug extending from the cord, the plug comprising:
      a first contact pad coupled to the first wire;
      a second contact pad coupled to the second wire;
      a ground trace extending between the first contact pad and the second contact pad;
      a ground pad coupled to the ground trace, the ground pad being located between the first and second contacts and the cord; and
      an overmold covering the ground trace, the overmold including at least a first aperture exposing the first contact pad, a second aperture exposing the second contact pad, and a third aperture exposing the ground pad.

14. The electrical connector of claim 13, further comprising:
   a ground contact coupled to the ground trace, the ground contact being located on a side of the first and second contact pads that is distal to the cord,
   wherein the overmold covers the ground contact.

15. The electrical connector of claim 13, wherein the ground trace is less than half as wide as the first contact pad.

16. The electrical connector of claim 13, wherein:
   the first aperture and the second aperture form a row extending across the overmold; and
   the third aperture extends in a direction parallel to the row with a length at least as great as the row.

17. The electrical connector of claim 13, further comprising:
   a third contact pad coupled to a third wire,
   wherein the cord further comprises the third wire,
   wherein the first contact pad and second contact pad are differential signaling pads, wherein the plug does not include a ground trace extending between the second contact pad and the third contact pad.

18. The electrical connector of claim 13, further comprising:
   a third contact pad coupled to a third wire,
   wherein the cord further comprises the third wire,
   wherein the second contact pad and third contact pad are differential signaling pads,
   wherein the plug does not include a ground trace extending between the second contact pad and the third contact pad.

19. An electrical connector comprising:
   a cord comprising a first wire, a second wire, a third wire, a fourth wire, a fifth wire, a sixth wire, and a seventh wire; and
   a plug extending from the cord, the plug comprising:
      a first signal pad coupled to the first wire;
      a second signal pad coupled to the second wire;
      a third signal pad coupled to the third wire;
      a fourth signal pad coupled to the fourth wire;
      a fifth signal pad coupled to the fifth wire;
      a sixth signal pad coupled to the sixth wire;
      a seventh signal pad coupled to the seventh wire;
      a first ground trace adjacent to the first signal pad;
      a second ground trace on an opposite side of the first signal pad from the first ground trace and extending between the first signal pad and the second signal pad;
      a third ground trace extending between the second signal pad and the third signal pad;
      a fourth ground trace extending between the third signal pad and the fourth signal pad;
      a fifth ground trace extending between the fourth signal pad and the fifth signal pad;
      a sixth ground trace extending between the fifth signal pad and the sixth signal pad;
      a seventh ground trace extending between the sixth signal pad and the seventh signal pad;
      an eighth ground trace extending on an opposite side of the seventh signal pad from the seventh ground trace;
      a ground contact coupled to the first ground trace, the second ground trace, the third ground trace, the fourth ground trace, the fifth ground trace, the sixth ground trace, the seventh ground trace, and the eighth ground trace, the ground contact being farther from the cord than the first signal pad, the second signal pad, the third signal pad, the fourth signal pad, the fifth signal pad, the sixth signal pad, and the seventh signal pad;
      a ground pad coupled to the first ground trace, the second ground trace, the third ground trace, the fourth ground trace, the fifth ground trace, the sixth ground trace, the seventh ground trace, and the eighth ground trace, the ground pad being closer to the cord than the first signal pad, the second signal pad, the third signal pad, the fourth signal pad, the fifth signal pad, the sixth signal pad, and the seventh signal pad; and
      an overmold covering the first ground trace, the second ground trace, the third ground trace, the fourth ground trace, the fifth ground trace, the sixth ground trace, the seventh ground trace, the eighth ground trace, and the ground contact, the overmold including at least a first aperture exposing the first signal pad, a second aperture exposing the second signal pad, a third aperture exposing the third signal pad, a fourth aperture exposing the fourth signal pad, a fifth aperture exposing the fifth signal pad, a sixth aperture exposing the sixth signal pad, a seventh aperture exposing the seventh signal pad, and an eighth aperture exposing the ground pad.

* * * * *